Oct. 21, 1969 R. CULLIS 3,473,975

SEMICONDUCTOR DEVICES

Filed Dec. 9, 1965

Inventor
ROGER CULLIS
By Percy P. Lantzy
Attorney

United States Patent Office 3,473,975
Patented Oct. 21, 1969

3,473,975
SEMICONDUCTOR DEVICES
Roger Cullis, London, England; assignor to International Standard Electric Corporation, New York, N.Y., a corporation of Delaware
Filed Dec. 9, 1965, Ser. No. 512,645
Claims priority, application Great Britain, Feb. 1, 1965, 4,290/65
Int. Cl. H01l 7/36
U.S. Cl. 148—175 7 Claims

ABSTRACT OF THE DISCLOSURE

This is a method of manufacturing planar transistors so as to prevent that portion of the base region directly beneath the emitter from expanding into the collector in a non-planar fashion. This is accomplished by growing a layer on a body, said layer being of a material of opposite conductivity type to the conductivity of said body so as to form a pn-junction therebetween, said body representing a collector region. A base region of higher impurity concentration but of the same conductivity type as said layer is diffused into said layer. An emitter region having the same conductivity as said body is diffused into the base region causing that portion of the base region directly beneath the emitter region to extend toward but not beyond the pn-junction formed between said layer and said body.

This invention relates to semiconductor devices and more particularly to transistors.

It is an object of the invention to provide an improved method of processing using diffusion techniques.

According to one aspect of the present invention there is provided a method of making a transistor or transistors including growing a layer of semiconductor material of one conductivity type on the surface of a wafer of said semiconductor material of the opposite conductivity type forming a pn-junction between said layer and said wafer, diffusing impurity material of said one conductivity type into first regions of said layer, diffusing impurity material of opposite conductivity type into second regions within said first regions, diffusing further impurity material of said opposite conductivity type into third regions completely surrounding said first regions extending through said layer into the wafer and isolating predetermined regions of said layer and applying contact electrodes to said first and said second regions.

According to an alternative aspect of the invention there is provided a method of making a transistor or transistors including the steps of growing a layer of semiconductor material of one conductivity type in predetermined regions on the surface of a wafer of semiconductor material of the opposite conductivity type forming junctions between said layer and said wafer, diffusing impurity material of said one conductivity type into first regions within said predetermined regions, diffusing impurity material of said opposite conductivity type into second regions within said first regions and applying contact electrodes to said first and said second regions.

Further according to the invention there is provided a method of making a transistor having a reduced collector-base capacitance comprising the steps of growing a layer of semiconductor material of high resistivity and of one conductivity type on a wafer of semiconductor material of the opposite conductivity type, diffusing impurity material of said one conductivity type into first regions of said layer and diffusing impurity material of said opposite conductivity type to form emitter regions within said first regions said second diffusion being carried out in such a manner as to enhance the rate of diffusion of the impurity material of said one conductivity type beneath said emitter regions, whereby the semiconductor material constituting said transistor is heavily doped due to the impurity material of said one conductivity type in the vicinity of the collector-base junction only in the regions beneath said emitter regions.

The invention will be particularly described with reference to the accompanying drawings in which.

In the production of transistors by so-called double-diffusion technique base regions are formed by diffusion of impurity material of one conductivity type into a semiconductor wafer of opposite conductivity type. Emitter regions are subsequently formed within the base regions by diffusion of material of the opposite conductivity type. It has been found that in the vicinity of the diffused emitter regions the diffusion constant of the base impurity material is effectively enhanced. This has been attributed to strains set up in the crystal lattice by the high concentrations of impurity required for the emitter diffusion. This phenomenon results in extraordinary movement of the collector-base junction beneath the emitter regions and is most pronounced in transistors designed for the highest operating frequencies as these have shallow junctions in combination with high doping levels.

Figure 1:
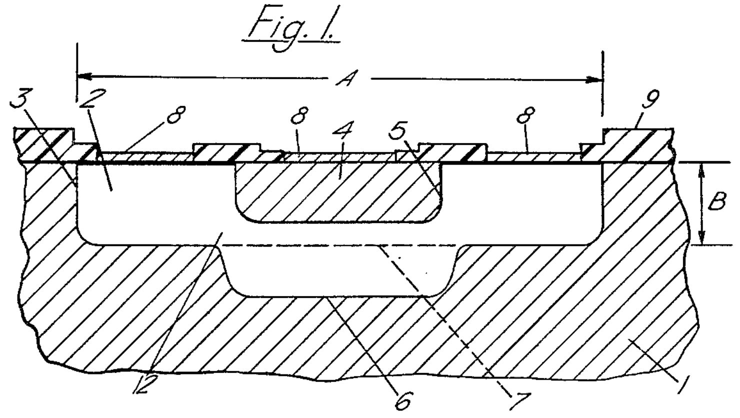
FIGURE 1 shows a cross-section through a transistor produced by normal double-diffusion techniques.

The effect known as "run-ahead" is illustrated in FIGURE 1, which shows in cross-section a normal double-diffused transistor structure. A base diffusion 2 is made in a semiconductor wafer 1, forming a pn-junction 3. An emitter diffusion 4 is made forming the emitter-base junction 5. During the emitter diffusion the collector-base junction beneath the emitter region advances due to the enhanced diffusion. This is shown at 6, and the position it would have occupied is depicted by the broken line 7. Contacts 8 are applied to the emitter and base regions, and the surface of the transistor is protected by a layer 9 of insulating material. Due to the non-planarity of the collector-base junction there is a non-uniform distribution of collector current, a large proportion flowing across the narrow region of the base 12, giving rise to deleterious effects such as reduction of collector breakdown voltage and non-optimum high frequency response.

In the diagram, lateral and upright scales are made different for illustrative purposes. Dimension A is of the order of 100 microns and dimension B is about two microns.

The previously considered undesirable effect of "run-ahead" may, however, be utilized to advantage.

Figure 2:
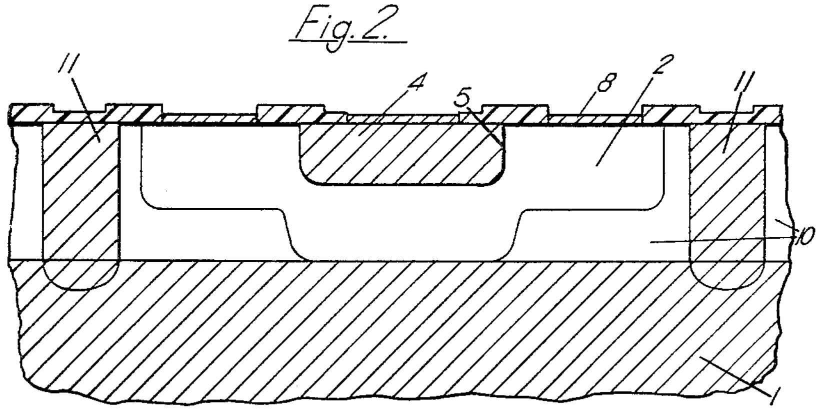
FIGURE 2 shows a corresponding cross-section through a transistor produced by techniques according to one aspect of the present invention.

Referring now to FIGURE 2, this shows in cross-section a transistor produced according to one embodiment of the present invention. A layer 10 of semiconductor material of the same conductivity type as the base region is grown on the surface of a semiconductor wafer 1. The thickness of this layer is equal to the ultimate collector-base junction depth of the transistor and its impurity concentration is equal to that in the vicinity of the surface of the wafer on which it is grown. The latter may, in turn, comprise a high resistivity layer grown on a substrate of the same conductivity type but lower resistivity. Emitter and base diffusions are made in the normal manner, and "run-ahead" causes the base diffusant to advance to the junction between the layer 10 and the wafer 1 beneath the emitters. In this case, however, the base diffusion is made from a smaller area of the surface of the wafer than in the normal case; the base area is then defined by an isolating diffusion 11 which extends through the layer 10 into the wafer 1. If the conditions of diffusant concentration and layer doping level are suitable (as may readily be ascertained by one skilled in the art) the isolation and emitter diffusions may be performed at the same time.

Since the doping levels of the wafer and layer are substantially equal little movement of the collector-base junction formed between them will occur during the diffusion processes and control of the ultimate transistor will therefore be improved.

Furthermore, due to the phenomenon of "run-ahead," the heavily doped region of the base formed by the diffusion process will only be contiguous with the collector-base junction beneath the emitter regions. The remainder of the base region adjacent the collector-base region will be of high resistivity material as will be seen by reference to FIGURE 2. This gives rise to a reduction in collector-base capacitance, a typical value for the improvement being 30 percent.

A layer 10 with a lower doping level may be employed to reduce the collector-base capacitance by a greater amount. In this case, and also in the case where the diffusion constants of the dopants use for the wafer and the base epitaxial layer are substantially different, allowance will have to be made for movement of the junction during the diffusion processes. This is, however, quite amenable to calculation, or may be determined experimentally.

Comparison of FIGURES 1 and 2 will show that in the latter the base diffusion does not extend beyond the area required for the base contacts. This will not adversely affect the performance of the transistor since the region of the base diffusion in FIGURE 1 outside the base contact makes little contribution to the reduction of extrinsic base resistance.

The principles of the invention may, for example, be advantageously employed in the fabrication of a silicon transistor using silicon dioxide masking techniques. Boron and phorphorus may be used as p- and n-type dopant respectively and suitable dopant surface concentrations are $3\times10^{19}$ atoms/cm.$^3$ for the base diffusion and $10^{21}$ atoms/cm.$^3$ for the emitter diffusion for an npn transistor. A typical value for the collector-base junction depth and of the p-type epitaxial layer thickness is two microns and for the doping level of the wafer and layer $6\times10^{15}$ atoms/cm.$^3$ (corresponding to one ohm-cm. n-type).

Although the use of isolation diffusions has been described to delimit the base areas, transistors could equally well be made using localized epitaxial deposition for this purpose. This would give a further, small improvement in capacitance for an equivalent geometry since the only diffused region contiguous with the collector-base junction would be that beneath the emitters.

The invention is not restricted to the use of silicon as it can be employed with any semiconductor material in which double-diffused transistors can be made and in which the rate of diffusion of dopants can be suitably enhanced.

It is to be understood that the foregoing description of specific examples of this invention is made by way of example only and is not to be considered as a limitation on its scope.

What I claim is:

1. A method of making a semiconductive device including growing a layer of semiconductor material of one conductivity type on the surface of a wafer of said semiconductor material of the opposite conductivity type forming a pn-junction between said layer and said wafer, diffusing impurity material of said one conductivity type into first regions of said layer, diffusing impurity material of opposite conductivity type into second regions within said first regions, diffusing further impurity material of said opposite conductivity type into third regions completely surrounding said first regions extending through said layer into the wafer and isolating predetermined regions of said layer and applying contact electrodes to said first and said second regions.

2. A method as claimed in claim 1 wherein said second and said third regions are formed during the same diffusion process.

3. A method as claimed in claim 1 wherein the concentration of impurity material of said one conductivity type forming said first regions exceeds concentration of the impurity of opposite conductivity type within said wafer in the vicinity of said junction.

4. A method as claimed in claim 3 wherein the concentration of impurity material comprising said layer except for said first regions is substantially equal to the concentration of impurity material in said wafer in the vicinity of said junction over at least part of the area of said junction.

5. A method as claimed in claim 4 wherein the surface of said layer is protected by a layer of insulating material deposited or grown thereon.

6. A method as claimed in claim 5 wherein the semiconductor material is silicon and the insulating material is silicon dioxide.

7. A method of making semiconductor devices according to claim 1, said semiconductor devices having reduced collector base capacitance, wherein said layer of semiconductive material of one conductivity type is of high resistivity and diffusing impurity material of said opposite conductivity type into said second regions forms emitter regions within said first regions, during said second diffusion of said one conductivity type into said second regions of said layer, the rate of diffusion of the impurity material of said one conductivity type beneath said emitter regions within said first regions being enhanced due to strains set up in the crystal lattice during said second diffusion of impurity materials, causing that portion of said first regions beneath said second regions to extend only within said layer toward said pn-junction.

References Cited

UNITED STATES PATENTS

| | | | |
|---|---|---|---|
| 3,226,613 | 12/1965 | Haenichen | 317—234 |
| 3,289,267 | 12/1966 | Ullrich | 29—578 |
| 3,290,189 | 12/1966 | Migitaka et al. | 148—188 |
| 3,370,995 | 2/1968 | Lowery et al. | 148—174 |

L. DEWAYNE RUTLEDGE, Primary Examiner

R. A. LESTER, Assistant Examiner

U.S. Cl. X.R.

29—576, 578; 148—174, 186, 187